(12) United States Patent
Yun et al.

(10) Patent No.: US 8,446,194 B2
(45) Date of Patent: May 21, 2013

(54) SPREAD SPECTRUM CLOCK GENERATING CIRCUIT

(75) Inventors: Seok Ju Yun, Daejeon (KR); Hui Dong Lee, Daejeon (KR); Kwi Dong Kim, Daejeon (KR); Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/275,753

(22) Filed: Oct. 18, 2011

(65) Prior Publication Data

US 2012/0105114 A1 May 3, 2012

(30) Foreign Application Priority Data

Nov. 3, 2010 (KR) .................. 10-2010-0108683

(51) Int. Cl.
 *H03L 7/06* (2006.01)
(52) U.S. Cl.
 USPC .......................................... 327/156; 327/147
(58) Field of Classification Search
 USPC .................................................. 327/147, 156
 See application file for complete search history.

(56) References Cited

U.S. PATENT DOCUMENTS

| | | | |
|---|---|---|---|
| 7,046,738 B1* | 5/2006 | Dent ............................. | 375/296 |
| 7,558,311 B2 | 7/2009 | Shin et al. | |
| 7,764,094 B1* | 7/2010 | Arora ............................. | 327/157 |
| 8,258,835 B1* | 9/2012 | Morand et al. ................ | 327/156 |
| 8,269,536 B2* | 9/2012 | Huang et al. .................. | 327/159 |
| 2008/0074154 A1 | 3/2008 | Shin | |
| 2010/0164562 A1* | 7/2010 | Tseng et al. .................. | 327/118 |
| 2011/0156782 A1* | 6/2011 | Huang et al. .................. | 327/159 |
| 2012/0013375 A1* | 1/2012 | Kuramochi .................... | 327/156 |
| 2012/0063632 A1* | 3/2012 | Aoki et al. ..................... | 381/400 |
| 2012/0105114 A1* | 5/2012 | Yun et al. ...................... | 327/156 |
| 2012/0242384 A1* | 9/2012 | Kato ............................. | 327/157 |
| 2012/0306657 A1* | 12/2012 | Acena et al. .................. | 340/664 |

OTHER PUBLICATIONS

Yi-Bin Hsieh et al., "A Fully Integrated Spread-Spectrum Clock Generator by Using Direct VCO Modulation", IEEE Transactions on Circuits and Systems—I: Regular Papers, Aug. 2008, pp. 1845-1853, vol. 55, No. 7.
Hsiang-Hui Chang et al., "A Spread-Spectrum Clock Generator With Triangular Modulation", IEEE Journal of Solid-State Circuits, Apr. 2003, pp. 673-676, vol. 38, No. 4.

\* cited by examiner

*Primary Examiner* — Adam Houston

(57) ABSTRACT

Provided is a spread spectrum clock generating circuit. The spread spectrum clock generating circuit includes: a phase detector receiving a reference frequency signal from the external and detecting a phase difference between the reference frequency signal and a frequency-divided signal; a voltage controlled oscillator outputting an oscillation signal corresponding to a detection result of the phase detector; a main divider generating the frequency-divided signal by dividing a frequency of the oscillation signal by a main dividing ratio; and a dividing ratio controller generating a variable count value, generating a sub dividing ratio by performing delta-sigma modulation according to the count value, and adjusting the main dividing ratio according to the sub dividing ratio.

11 Claims, 5 Drawing Sheets

SPREAD SPECTRUM CLOCK GENERATING CIRCUIT

CROSS-REFERENCE TO RELATED APPLICATIONS

This U.S. non-provisional patent application claims priority under 35 U.S.C. §119 of Korean Patent Application No. 10-2010-0108683, filed on Nov. 3, 2010, the entire contents of which are hereby incorporated by reference.

BACKGROUND OF THE INVENTION

The present invention disclosed herein relates to a frequency generator and a clock generator, and more particularly, to a spread spectrum clock generating circuit.

A Phase Locked Loop (PLL) generates an oscillation signal having a fixed frequency in response to a reference clock signal inputted from the external. The oscillation signal is provided as an operating clock of a system having the PLL.

Recently, as a system needs to operate at a higher speed and have the higher degree of integration so as to process digital data of a large capacity, a frequency of a clock signal that the system requires becomes higher. If a frequency of a clock signal becomes higher, Electro Magnetic Interference (EMI) may occur to cause system failure. That is, a high frequency signal (i.e., a clock signal) with high energy affects peripheral systems to cause malfunctions. In order to reduce EMI, a spread spectrum clock generating circuit is provided. The spread spectrum clock generating circuit adjusts an oscillation signal to distribute energy in frequencies of a broad band width.

SUMMARY OF THE INVENTION

The present invention provides a spread spectrum clock generating circuit controlling a dividing ratio to reduce Electro Magnetic Interference (EMI) occurring due to an oscillation frequency.

Embodiments of the present invention provide spread spectrum clock generating circuits including: a phase detector receiving a reference frequency signal from the external and detecting a phase difference between the reference frequency signal and a frequency-divided signal; a voltage controlled oscillator outputting an oscillation signal corresponding to a detection result of the phase detector; a main divider generating the frequency-divided signal by dividing a frequency of the oscillation signal by a main dividing ratio; and a dividing ratio controller generating a variable count value, generating a sub dividing ratio by performing delta-sigma modulation according to the count value, and adjusting the main dividing ratio according to the sub dividing ratio.

In some embodiments, the dividing ratio controller may include a delta-sigma modulator; and the delta-sigma modulator may calculate a ratio of a scale of the count value to the count value and may perform the delta-sigma modulation according to a calculated ratio.

In other embodiments, the delta-sigma modulator may generate first and second logic values; and a ratio of the generated first and second logic values may be determined by the calculated ratio.

In still other embodiments, the delta-sigma modulator may generate the first and second logic values in response to a signal that the oscillation signal is divided.

In even other embodiments, the count value may be variable in response to a predetermined signal; and a frequency value of the signal that the oscillation signal is divided may be greater than that of the predetermined clock signal.

In yet other embodiments, the dividing ratio controller may determine the main dividing ratio by calculating a reference dividing ratio fixed with a predetermined value and the sub dividing ratio.

In further embodiments, as the count value is changed, a value of the main dividing ratio may be changed.

In still further embodiments, according to a calculation result of a frequency of the reference frequency signal and the main dividing ratio, a frequency of the oscillation signal may be determined; and as a value of the main dividing ratio is changed, the frequency of the oscillation signal may be changed.

In even further embodiments, the dividing ratio controller may include a triangle wave generator; and the triangle wave generator generates the count value in response to the reference frequency signal.

In yet further embodiments, the triangle wave generator may include a counter; and the counter may change the count value sequentially within a specific range.

In yet further embodiments, the triangle wave generator may further include first and second dividers generating respective first and second sub frequency-divided signals by dividing the reference frequency signal; and the counter operates in response to a shift of the first sub frequency-divided signal and increases or decreases the count value according to a logic value of the second sub frequency-divided signal.

In yet further embodiments, the dividing ratio controller may include an adder receiving a reference dividing ratio from the external; and the adder may determine the main diving ratio by adding the reference dividing ratio to the sub dividing ratio.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
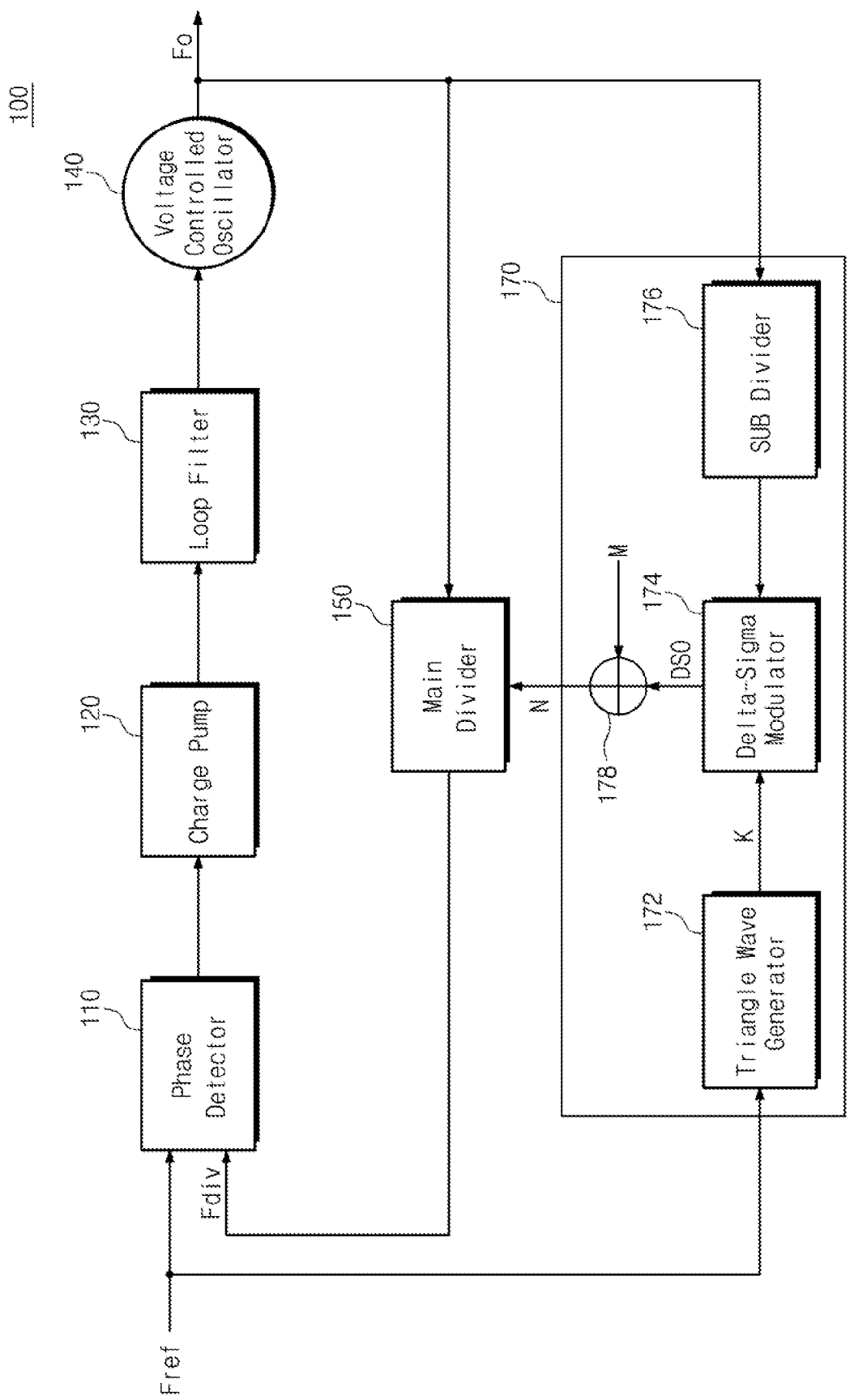
FIG. 1 is a block diagram illustrating a spread spectrum clock generating circuit 100 according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. In this disclosure below, when one part (or element, device, etc.) is referred to as being 'connected' to another part (or element, device, etc.), it should be understood that the former can be 'directly connected' to the latter, or 'electrically connected' to the latter via an intervening part (or element, device, etc.). Furthermore, when it is described that one comprises (or includes or has) some elements, it should be understood that it may comprise (or include or has) only those elements, or it may comprise (or include or have) other elements as well as those elements if there is no specific limitation.

Hereinafter, it will be described about an exemplary embodiment of the present invention with reference to the accompanying drawings.

FIG. 1 is a block diagram illustrating a spread spectrum clock generating circuit 100 according to an embodiment of the present invention. Referring to FIG. 1, the spread spectrum clock generating circuit 100 includes a phase detector 110, a charge pump 120, a loop filter, a voltage controlled oscillator 140, a main divider 150, and a dividing ratio controller 170.

The phase detector 110 receives a reference frequency signal Fref. The reference frequency signal Fref may be provided from a crystal oscillator (not shown). Moreover, the phase detector 110 also receives a frequency-divided signal Fdiv from the main divider 150.

The phase detector 110 detects a phase difference between the reference frequency signal Fref and the frequency-divided signal Fdiv. Also, the phase detector 110 generates an output signal according to a detection result. For example, the phase detector 110 may transmit an up signal (not shown) or a down signal (not shown) to the charge pump 120.

The charge pump 120 generates charges or current in response to the output of the phase detector 110. For example, on receiving the up signal from the phase detector 110, the charge pump 120 provides source current to the loop filter 130. Then, on receiving the down signal from the phase detector 110, the charge pump 120 may sink current.

The loop filter 130 includes a capacitor. The capacitor of the loop filter 130 is charged or discharged according to an output of the charge pump 120. The loop filter 130 outputs a predetermined voltage according to the amount of charge charged into the capacitor or discharged from the capacitor. For example, the loop filter 130 may generate higher voltage when current is provided from the charge pump 120 compared to when the charge pump 120 sinks current. The loop filter 130 may be a low pass filter for filtering a high frequency component from the output of the charge pump 120.

The voltage controlled oscillator 140 generates an oscillation signal Fo corresponding to the output voltage of the loop filter 130. As a gain of the voltage controlled oscillator 140 becomes greater, the voltage controlled oscillator 140 may output an oscillation signal Fo having a higher frequency. However, as a gain of the voltage controlled oscillator 140 becomes greater, the voltage controlled oscillator 140 becomes venerable to noise, so that jitter of the oscillation signal Fo may be increased.

The main divider 150 receives the oscillation signal Fo from the voltage controlled oscillator 140. The main divider 150 divides the oscillation signal Fo according to a predetermined dividing ratio and transmits a frequency-divided signal Fdiv to the phase detector 110.

According to an embodiment of the present invention, the dividing ratio of the main divider 150 is adjusted in response to a control of the dividing ratio controller 170. As the dividing ratio of the main divider 150 is adjusted, a frequency of the oscillation signal may vary.

The dividing ratio of the main divider 150 is determined according to a main dividing ratio N received from the dividing ratio controller 170. The main divider 150 divides the oscillation signal Fo by the main dividing ratio N and generates a frequency-divided signal Fdiv. That is, since the dividing ratio controller 170 adjusts the main dividing ratio N, a dividing ratio of the main divider 150 is adjusted.

A frequency of the oscillation signal Fo may be expressed with the product of the reference frequency signal Fref and the main dividing ratio N.

$$FFo = FFref \cdot N \quad \text{[Equation 1]}$$

Referring to Equation 1, FFo represents a value of a frequency (hereinafter, referred to as an oscillation frequency) of an oscillation signal Fo. Also, FFref represents a value of a frequency of a reference frequency signal Fref. According to Equation 1, a frequency value of the oscillation signal Fo may be variable by adjusting the value of the main dividing ratio N.

According to frequency values of the reference frequency signal Fref and the oscillation signal Fo, a required value of the main dividing ratio N may be a decimal value. For example, it is assumed that an oscillation signal Fo having an average frequency value of about 2 GHz needs to be outputted through a reference frequency signal Fref of about 100 MHz and a frequency of the oscillation signal Fo needs to be changed by about 2%. At this point, a frequency of the oscillation signal Fo may be variable within a range of about 2 GHz to about 2.2 GHz. According to Equation 1, a value of the main dividing ratio N provided to the main divider 150 needs to be variable within a range of about 20 to about 20.2. According to an embodiment of the present invention, by using a delta-sigma modulator 174, the main divider 150 may set a value of the main dividing ratio N as a decimal value even when it is an integer type divider.

The dividing ratio controller 170 includes a triangle wave generator 172, the delta-sigma modulator (or DSM) 174, a sub divider 176, and an adder 178. According to an embodiment of the present invention, the dividing ratio controller 170 generates a variable count value K and then adjusts the main dividing ratio N according to a sub dividing ratio DS0 generated by delta-sigma modulating the count value K.

The triangle wave generator 172 generates the count value K to change a value of the main dividing ratio N. Exemplarily, the count value K may consist of a plurality of bits.

The sub divider 176 receives the oscillation signal Fo and divides the oscillation signal Fo by a predetermined dividing ratio. Then, the signal divided by the sub divider 176 is provided as an operating clock of the delta-sigma modulator 174.

The delta-sigma modulator 174 receives the count value K from the triangle wave generator 172. The delta-sigma modulator 174 operates in response to the signal received from the sub divider 176. For example, the signal received from the sub divider 176 may be a clock signal having a predetermined frequency value.

According to the ratio of a scale value corresponding to the number of bits outputted from the triangle wave generator 172 to the count value K, the delta-sigma modulator 174 generates a sub dividing ratio DS0. That is, the delta-sigma modulator 174 calculates the ratio of a scale of the count value K to the count value K and performs delta-sigma modulation on the calculated ratio to determine a value of the sub dividing ratio DS0. Exemplarily, the delta-sigma modulator 174 divides the counter value K by a scale value of the count value K and generates the sub dividing ratio DS0. For example, a value of the sub dividing ratio DS0 is between about 0 and about 1.

The delta-sigma modulator 174 generates the sub dividing ratio DS0 of a digital signal. Exemplarily, the delta-sigma modulator 174 may output a digital signal of 1 bit. The sub dividing ratio DS0 may be a high-speed bit stream signal having first and second logic values. Additionally, a value of the sub dividing ratio DS0 may be determined by the ratio of the first and second logic values. For example, a value of the sub dividing ratio DS0 may be determined by the ratio of logic values "1" and "0" in the bit stream signal.

It is assumed that the sub dividing ratio DS0 is a digital signal of 1 bit, and a value of the sub dividing ratio DS0 is 0.5. In this case, the delta-sigma modulator 174 generates the logic value "1" and the logic value "0" with the ratio of 1:1. As another example, when a value of the sub dividing ratio DS0 is assumed to be 0.2, the delta-sigma modulator 174 generates the logic value "1" and the logic value "0" with the ratio of 4:1.

As a result, the delta-sigma modulator 174 outputs a digital signal but a value of the sub dividing ratio DS0 may be greater than 0 and less than 1. By using the delta-sigma modulator 174, even when the main divider 150 receiving the main dividing ratio N is an integer type divider, the main dividing ratio N having a decimal value may be used.

The delta-sigma modulator 174 may operate at a high sampling rate. For example, a frequency of an operating clock of the delta-sigma modulator 174 may be higher than that of the triangle wave generator 172.

The adder 178 receives the sub dividing ratio DS0. The adder 178 receives a reference dividing ratio M fixed with a predetermined value. Moreover, the adder 178 may transmit the main dividing ratio N, obtained by adding the reference dividing ratio M to the sub dividing ratio DS0, to the main divider 150. Since the reference dividing ratio M has a fixed value and a value of the sub dividing ratio DS0 is changed, the main dividing ratio N is adjusted according to the sub dividing ratio DS0.

According to exemplary embodiments of the present general inventive concept, the dividing ratio of the main divider 150 is adjusted according to the main dividing ratio N of a digital signal. Accordingly, a spread spectrum clock generating circuit is provided, with improved reliability over a case where current of the charge pump 120 and a capacitor value of the loop filter 130 are adjusted.

The spread spectrum clock generating circuit 100 generates an oscillation signal FFo corresponding to Equation 2.

$$FFo = \left(M + \frac{K}{F}\right) \cdot Fref = M \cdot \left(1 + \frac{K}{M \cdot F}\right) \cdot Fref \quad \text{[Equation 2]}$$

Referring to Equation 2, F represents a scale value corresponding to the number of bits outputted from the triangle wave generator 172. That is, F represents a scale value corresponding to the number of bits of the count value K. For example, if it is assumed that the triangle wave generator 172 generates an output signal consisting of 23 bits, F is $2^{23}$.

The delta-sigma modulator 174 generates a sub dividing ratio DS0 calculated by dividing the count value K by the scale value F. Accordingly, $$\frac{K}{F}$$

may correspond to a value of the output signal DS0 of the delta-sigma modulator 174.

$$M + \frac{K}{F}$$

may correspond to a value of the main dividing ratio N outputted from the adder 178.

Figure 2:
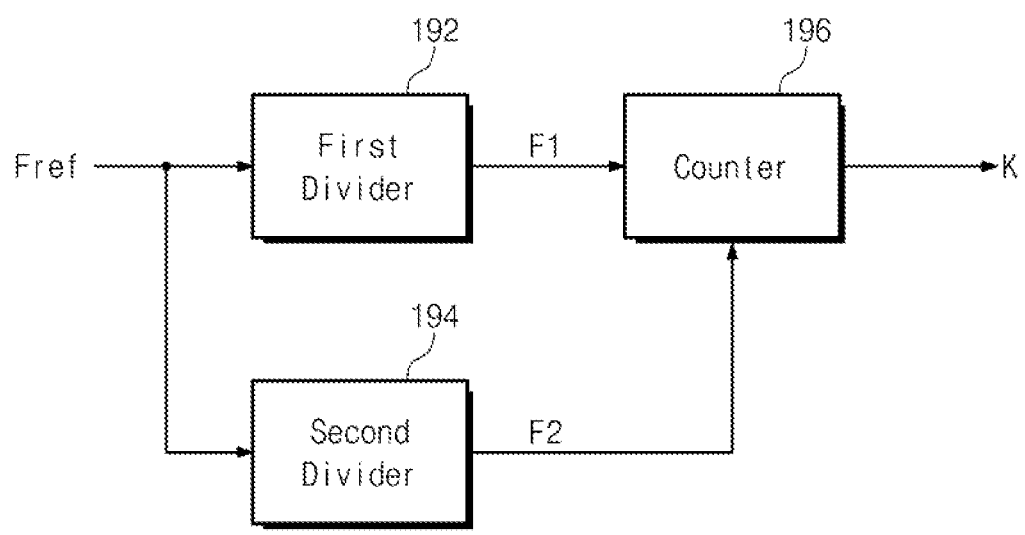
FIG. 2 is a block diagram illustrating the detailed triangle wave generator of FIG. 1.

FIG. 2 is a block diagram illustrating the detailed triangle wave generator 172 of FIG. 1. Referring to FIG. 2, the triangle wave generator 172 includes first and second dividers 192 and 194 and a counter 196.

The first and second dividers 192 and 194 receive a reference frequency signal Fref. Additionally, the first and second dividers 192 and 194 divide the reference frequency signal Fref by respective predetermined dividing ratios and generate first and second sub frequency-divided signals F1 and F2.

The counter 196 receive the first and second sub frequency-divided signals F1 and F2. The counter 196 operates in synchronization with the first sub frequency-divided signal F1. For example, the counter 196 changes a count value in synchronization with a case that the first sub frequency-divided signal F1 shifts from the logic value "0" into the logic value "1".

The counter 196 may increase or decrease the count value K according to the second sub frequency-divided signal F2. For example, when the logic value of the second sub frequency-divided signal F2 is "1", the counter 196 may increase the count value K in synchronization with the first sub frequency-divided signal F1. When the logic value of the second sub frequency-divided signal F2 is "0", the counter 196 may decrease the count value K in synchronization with the first sub frequency-divided signal F1.

Figure 3:
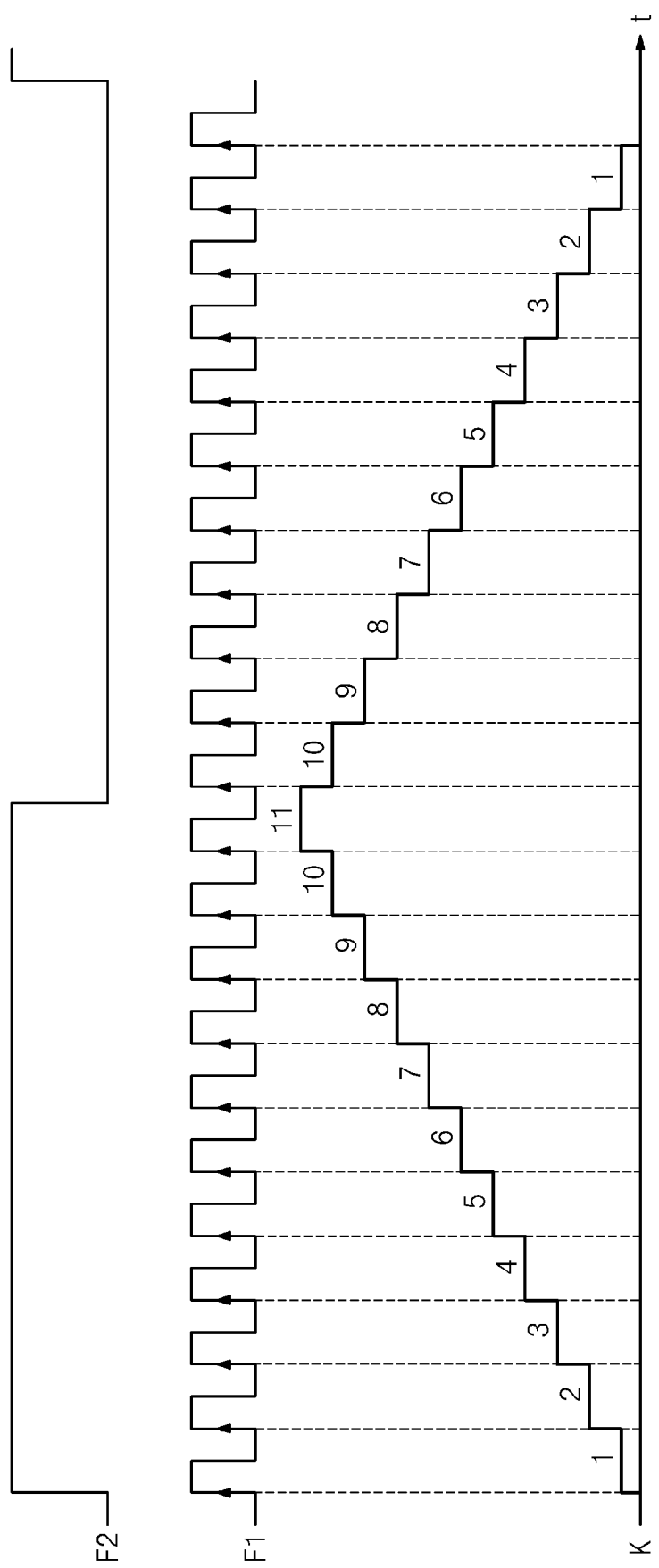
FIG. 3 is a timing diagram illustrating a count value K outputted from the triangle wave generator of FIG. 2.

FIG. 3 is a timing diagram illustrating a count value K outputted from the triangle wave generator 172 of FIG. 2. Referring to FIG. 3, when the counter 196 receives the first and second sub frequency-divided signals F1 and F2, a count value K changed according a time t is shown.

The count value K is changed in response to a case that the logic value of the first sub frequency-divided signal F1 shifts from "0" into "1". That is, the first sub frequency-divided signal F1 may be provided as an operating clock of the triangle wave generator 172. Additionally, the count value K may change its value according to the first sub frequency-divided signal F1.

When the logic value of the second sub frequency-divided signal F2 is "1", the count value K is increased. When the logic value of the second sub frequency-divided signal F2 is "0", the count value K is decreased. In FIG. 3, when the logic value of the second sub frequency-divided signal F2 is "1", it is shown that the count value K is sequentially increased from 1 to 11 in response to a shift of the first sub frequency-divided signal F1. Also, when the logic value of the second sub frequency-divided signal F2 is "0", it is shown that the count value K is sequentially decreased from 11 to 1 in response to a shift of the first sub frequency-divided signal F1.

As a result, the triangle wave generator 172 may transmit the count value K, which is changed into a triangle wave form, to the delta-sigma modulator 174.

Figure 4:
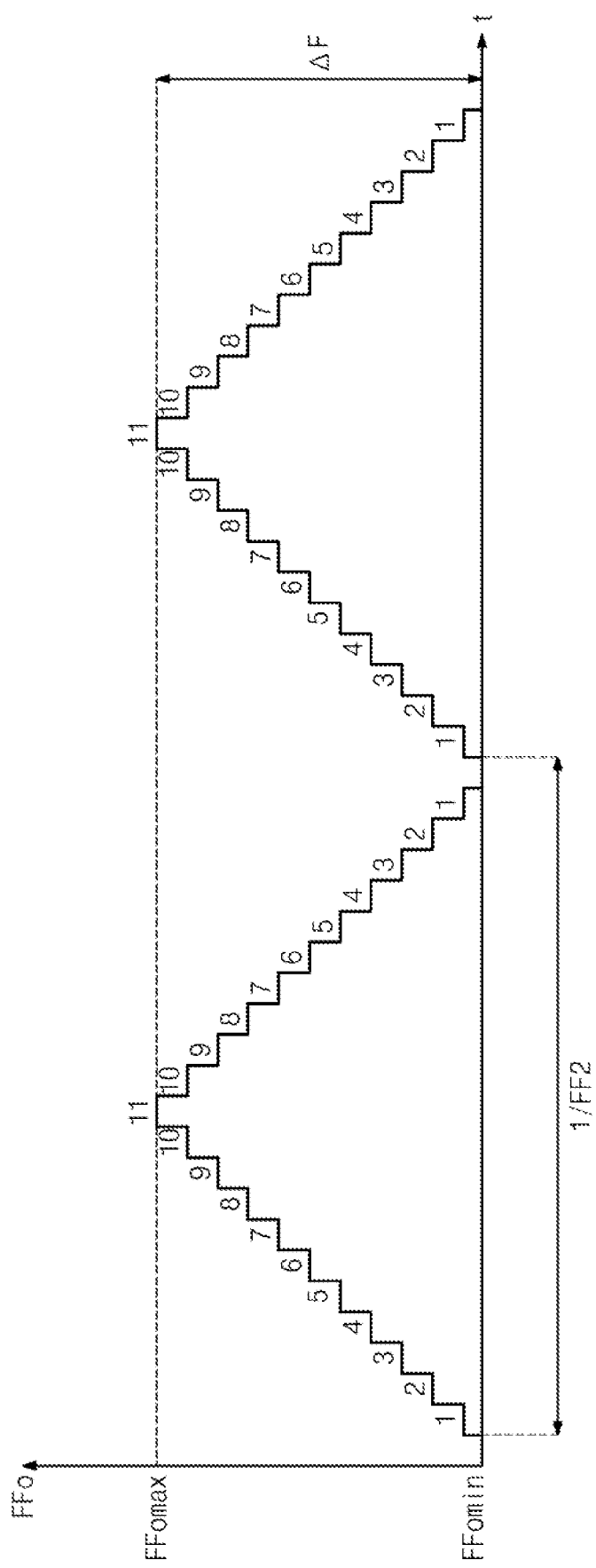
FIG. 4 is a graph illustrating a variable oscillation frequency FFo according to the count value K of FIG. 3.

FIG. 4 is a graph illustrating a variable oscillation frequency FFo according to the count value K of FIG. 3. Referring to FIG. 4, an x-axis represents time and a y-axis represents a frequency size.

As the count value K outputted from the triangle wave generator 172 is changed, a value of the main dividing ratio N is changed. Then, as a value of the main dividing ratio N is changed, the oscillation frequency FFo may be changed. In FIG. 4, count values K corresponding to respective values of the oscillation frequency FFo are shown. It is shown that the count value K is changed in a range between 1 and 11. If the count value K is the maximum, a value of the oscillation frequency FFo represents the maximum value FFomax. If the count value K is the minimum, a value of the oscillation frequency FFo represents the minimum value FFomin.

A period of the oscillation frequency FFo may be determined by the frequency FF2 of the second sub frequency-divided signal F2 of FIG. 2 in the triangle wave generator 172. That is, according to a triangle wave (i.e., a count value K) generated in the triangle wave generator 172, a period of the oscillation frequency FFo is determined As shown in FIG. 4, a period of the oscillation frequency FFo is determined by an inverse number of the frequency FF2 of the second sub frequency-divided signal F2. Accordingly, according to the frequency FF2 of the second sub frequency-divided signal F2, a period of the oscillation frequency FFo may be adjusted.

A range within which a value of the oscillation frequency FFo is changed is calculated with a difference between the maximum value FFomax and the minimum value FFomin of a value of the oscillation frequency FFo.

$$\Delta F = FFo\max - FFo\min = FFref(N\max = N\min) \quad [\text{Equation 3}]$$

Referring to FIG. 3, $\Delta F$ represents a range within which a value of the oscillation frequency FFo is changed. FFref represents a frequency value of a reference frequency signal Fref. Nmax and Nmin represent the maximum value and the minimum value of the main dividing ratio N, respectively. The maximum value FFomax of the oscillation frequency FFo is calculated as FFref·Nmax and the minimum value FFomin of the oscillation frequency FFo is calculated as FFref·Nmin.

According to Equation 3, the variable range $\Delta F$ of a value of the oscillation frequency FFo may be changed according to the maximum value Nmax and the minimum value Nmin of the main dividing ratio N. Accordingly, according to the maximum value Nmax and the minimum value Nmin of the main dividing ratio N, the variable range $\Delta F$ of a value of the oscillation frequency FFo may be adjusted.

When a modulation ratio of the oscillation frequency FFo is calculated with an average value of the oscillation frequency FFo and the variable range $\Delta F$ of the oscillation frequency FFo, the following Equation 4 is given.

$$MR = \frac{\Delta F}{FFom} \quad [\text{Equation 4}]$$

$$= \frac{FFo\max - FFo\min}{\frac{FFo\max + FFo\min}{2}}$$

$$= \frac{2(N\max - N\min)}{N\max + N\min}$$

Referring to Equation 4, MR represents a modulation ratio of the oscillation frequency FFo. Also, FFom represents an average value of the oscillation value FFo.

If FFo=Fref·N and this is substituted into Equation 4, the modulation ratio MR may be calculated with the maximum value Nmax and the minimum value Nmin of the main dividing ratio N. Accordingly, according to the maximum value Nmax and the minimum value Nmin of the main dividing ratio N, the modulation ratio MR may be adjusted.

Figure 5:
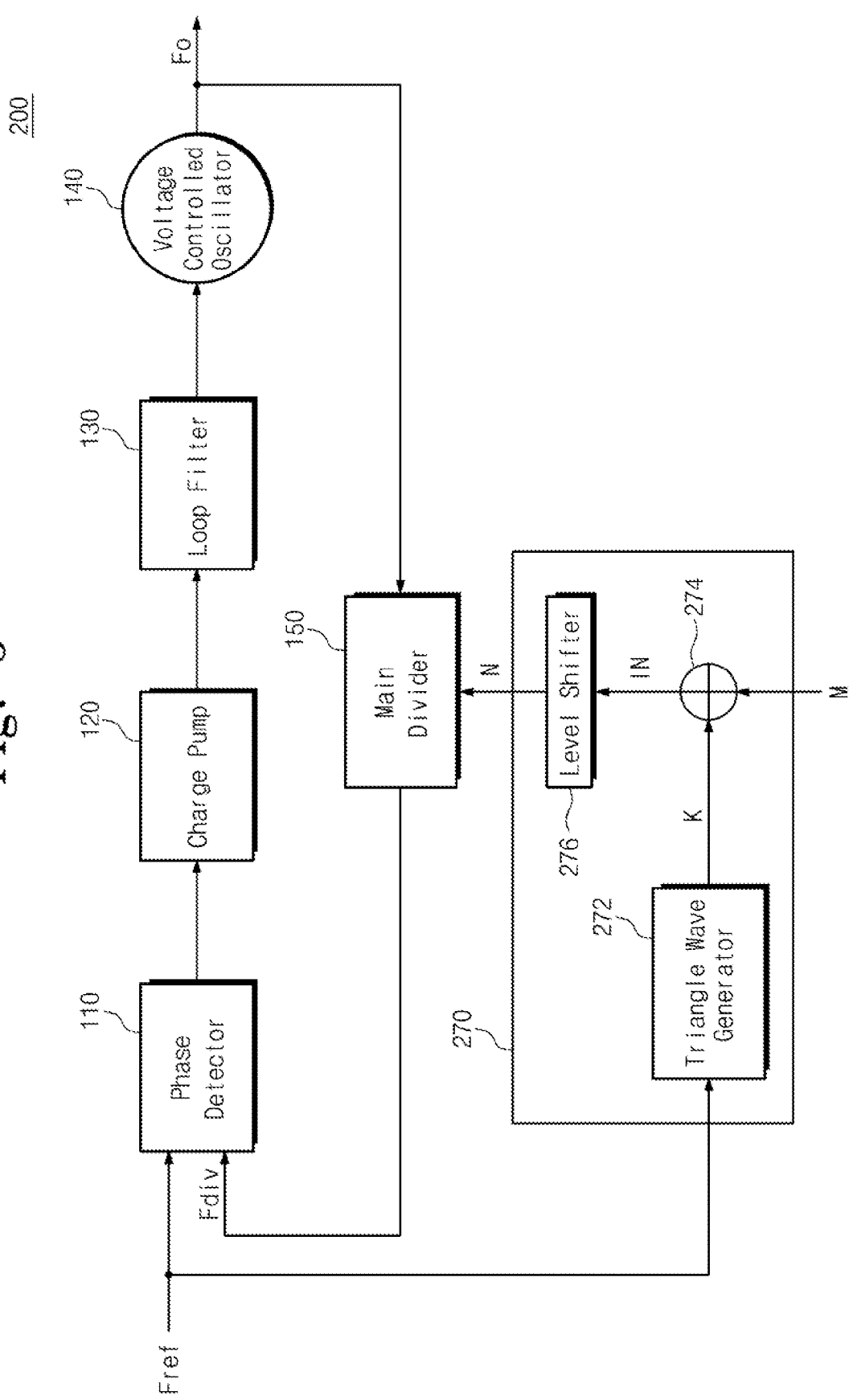
FIG. 5 is a block diagram illustrating a spread spectrum clock generating circuit according to a second embodiment of the present invention.

FIG. 5 is a block diagram illustrating a spread spectrum clock generating circuit 200 according to a second embodiment of the present invention. Referring to FIG. 5, the spread spectrum clock generating circuit 200 includes a phase detector 110, a charge pump 120, a loop filter 130, a voltage controlled oscillator 140, a main divider 150, and a dividing ratio controller 270. Except for the main divider 150 and the dividing ratio controller 270, the spread spectrum clock generating circuit 200 is the same as that of FIG. 1. Accordingly, components of the spread spectrum clock generating circuit 200 except for the main divider 150 and the dividing ratio controller 270 will not be described.

The dividing ratio controller 270 includes a triangle wave generator 272, an adder 274, and a level shifter 276. The triangle wave generator 272 is the same as that 172 of FIGS. 1 through 3. Accordingly, the triangle wave generator 272 will not be described.

The adder 274 receives a count value K from the triangle wave generator 272 and a reference dividing ratio M. Then, after adding the count value K to the reference dividing ratio M, an initial dividing ratio IN is transmitted into the level shifter 276. The initial dividing ratio IN consists of a plurality of bits.

As described with reference to FIG. 1, according to frequency values of the reference frequency signal Fref and the oscillation signal Fo, a required value of the main dividing ratio N may be a decimal value. At this point, when the initial dividing ratio IN corresponds to an integer value, the main dividing ratio N corresponding to a decimal value may be provided to the main divider 150 by changing a scale of the initial dividing ratio IN. The level shifter 276 right-shifts the received initial dividing ratio IN to generate the main dividing ratio corresponding to a decimal value.

The main divider 150 may divide a frequency of the oscillation signal Fo according to the main dividing ratio N. At this point, the main divider 150 may be a fractional divider.

According to an embodiment of the present invention, a spread spectrum clock is generated by controlling a dividing ratio with a digital signal. Accordingly, a spread spectrum clock generating circuit with improved reliability may be provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A spread spectrum clock generating circuit comprising:
   a phase detector configured to receive a reference frequency signal from an external node and detect a phase difference between the reference frequency signal and a frequency-divided signal;
   a voltage controlled oscillator configured to output an oscillation signal corresponding to an output signal of the phase detector;
   a main divider configured to generate the frequency-divided signal by dividing a frequency of the oscillation signal by a main dividing ratio; and
   a dividing ratio controller configured to generate a count value, to generate a sub dividing ratio by performing delta-sigma modulation according to the count value, and to change the main dividing ratio according to the sub dividing ratio,
   wherein the dividing ratio controller comprises a wave generator configured to generate the count value based on the reference frequency signal, the count value corresponding to a triangle wave.

2. The spread spectrum clock generating circuit of claim 1, wherein
   the dividing ratio controller further comprises a delta-sigma modulator, and
   wherein the delta-sigma modulator is configured to calculate a ratio of a scale of the count value to the count value and perform the delta-sigma modulation according to the calculated ratio to generate the sub dividing ratio.

3. The spread spectrum clock generating circuit of claim 2, wherein
   the delta-sigma modulator is configured to generate the sub dividing ratio including first and second logic values; and
   wherein a ratio of a number of the first logic values to a number of the second logic values is determined by the calculated ratio.

4. The spread spectrum clock generating circuit of claim 1, wherein the delta-sigma modulator is configured to generate the sub dividing ratio in response to a modulator operating signal generated by dividing the oscillation signal.

5. The spread spectrum clock generating circuit of claim 4, wherein
   the count value varies in response to a clock signal; and
   wherein a frequency of the modulator operating signal is greater than that of the clock signal.

6. The spread spectrum clock generating circuit of claim 1, wherein the dividing ratio controller is configured to determine the main dividing ratio based on a fixed reference dividing ratio and the sub dividing ratio.

7. The spread spectrum clock generating circuit of claim 1, wherein the main dividing ratio changes depending on the count value.

8. The spread spectrum clock generating circuit of claim 1, wherein the frequency of the oscillation signal changes depending on the main dividing ratio.

9. The spread spectrum clock generating circuit of claim 1, wherein
   the wave generator comprises a counter, and
   wherein the counter is configured to generate the count value corresponding to the triangle wave within a specific range.

10. The spread spectrum clock generating circuit of claim 9, wherein
    the wave generator further comprises first and second dividers configured to generate first and second sub frequency-divided signals, respectively, by dividing the reference frequency signal, and
    wherein the counter is configured to increase or decrease the count value in synchronization with the first sub frequency-divided signal according to a logic value of the second sub frequency-divided signal.

11. The spread spectrum clock generating circuit of claim 1, wherein
    the dividing ratio controller further comprises an adder configured to receive a reference dividing ratio from the external node; and
    wherein the adder is configured to determine the main diving ratio by adding the reference dividing ratio to the sub dividing ratio.

* * * * *